United States Patent [19]

Huang

[11] Patent Number: 5,494,843
[45] Date of Patent: Feb. 27, 1996

[54] METHOD FOR FORMING MOSFET DEVICES

[75] Inventor: Jenn-Ming Huang, Hsin, Taiwan

[73] Assignee: Taiwan Semiconductor Manufacturing Comp., Taiwan

[21] Appl. No.: 496,020

[22] Filed: Jun. 28, 1995

[51] Int. Cl.[6] .................... H01L 21/70; H01L 21/8244
[52] U.S. Cl. .................... 437/56; 437/48; 437/52; 437/57; 437/59; 437/34; 148/DIG. 82
[58] Field of Search .................. 437/34, 47, 48, 437/52, 57, 59, 44, 913; 148/DIG. 82

[56] References Cited

U.S. PATENT DOCUMENTS

| | | | |
|---|---|---|---|
| 4,366,613 | 1/1983 | Ogura et al. | 29/571 |
| 5,024,960 | 6/1991 | Haken | 437/57 |
| 5,047,358 | 9/1991 | Kosiak et al. | 437/57 |
| 5,158,463 | 10/1992 | Kim et al. | 437/57 |
| 5,254,487 | 10/1993 | Tamagawa | 437/34 |
| 5,324,680 | 6/1994 | Lee et al. | 437/48 |
| 5,432,114 | 7/1995 | O | 437/56 |

Primary Examiner—Tuan H. Nguyen
Attorney, Agent, or Firm—George O. Saile

[57] ABSTRACT

A method for fabricating CMOS chips, using a SRAM cell composed of, both NFET and PFET devices, or only NFETs, as well as incorporating NFET and PFET peripheral devices, is described. This process features an NFET, used in the SRAM cell, where a lightly doped arsenic source and drain region is used to achieve maximum device performance, in terms of saturation current, as well as gate to diffusion overlap capacitance. However the NFET used for the peripheral device is fabricated using a lightly doped phosphorous source and drain region, to allow for more protection against the deleterious hot carrier injection phenomena.

30 Claims, 5 Drawing Sheets

METHOD FOR FORMING MOSFET DEVICES

FIELD OF THE INVENTION

The present invention relates to a fabrication process for making semiconductor devices, and more specifically to a method of creating advanced MOSFET, (metal oxide semiconductor field effect transistors), structures, for application in CMOS, (complimentary metal oxide semiconductor), designs.

DESCRIPTION OF THE PRIOR ART

The rapid development of CMOS technology, incorporating both N type, (NFET), as well as P type, (PFET), devices on the same chip, have allowed the semiconductor community to develop specific designs using this advanced technology. One specific design uses a basic cell, composed of several NFET, as well as several PFET devices, while another design may be composed of only NFET devices. This specific cell configuration, using CMOS technology, can be used for static random access memory, (SRAM), applications. The SRAM cell, in combination with peripheral MOSFET devices, are being extensively used to create chips used for applications such as microprocessors. However the semiconductor industry, when proposing specific SRAM designs, using CMOS technology, demand specific performance critera for the cell, or SRAM devices, while a different set of design critera is applied to the peripheral devices.

For example, a pull down device, a NFET structure, in the SRAM cell, is enhanced by improved performance, in terms of saturation current, (Idsat). Performance improvements can also result from a reduction in gate to source and drain overlap capacitance. However sometimes process changes, incorporated to enhance performance can aggravate the short channel effect, leading to subthreshold leakage problems. One area addressed by CMOS designers, to enhance the performance of the SRAM, pull down NFET device, has been the delicate engineering of the lightly doped source and drain, (LDD), regions, originally introduced by Ogura, et al, in U.S. Pat. No. 4,366,613. This patent described a process for obtaining a structure that allowed channel length reductions to be achieved, while not adversely influencing the hot carrier electron, (HCE), phenomena. Therefore if one desired to enhance the performance of the NFET device, in the SRAM cell, the logical choice for an LDD process would be the use of an arsenic created region. For example the slow diffusing arsenic atom, when compared to the faster diffusing phosphorous atom, reduces the risk of short channel effects. In addition the increased concentration of the arsenic LDD region, results in less series resistance than counterparts created using phosphorous LDDs, thus improving the Idsat characteristics, and also results in less gate to source and drain overlap capacitance than phosphorous LDDs. However on the other hand the deleterious HCE phenomena becomes more prevalent as the concentration gradient between the LDD and the channel region increase, and this effect becomes a greater problem with arsenic, versus phosphorous LDDs. The SRAM cell device however operates at conditions that create very little substrate current, and thus are not significantly effected by the use of arsenic LDDs, however peripheral NFET devices, using the same arsenic LDD process, but operating at different conditions than the SRAM NFET counterparts, are adversely influenced.

This invention will describe a process for fabricating designs incorporating SRAM and peripheral MOSFET devices, in which performance enhancements are realized in the SRAM design by incorporating an arsenic LDD region, while reliability concerns for the peripheral NFET device, are relaxed via the use of a phosphorous created LDD region. In addition LOGIC/ASIC, (application specific integrated circuit), designs, can also be fabricated using both arsenic and phosphorous LDDs, based on the performance and reliability requirements of the specific design.

SUMMARY OF THE INVENTION

It is an object of this invention to provide a method for fabricating CMOS devices in which specific SRAM cell devices are constructed for enhanced performance, while specific peripheral devices are fabricated with enhanced reliability characteristics.

It is another object of this invention to fabricate specific SRAM, NFET devices, using an ion implanted arsenic LDD region, to enhance the performance characteristics of this device.

It is yet another object of this invention to eliminate the SRAM, NFET, threshold adjust ion implant step, of the cell devices, due to the reached risk of subthreshold leakage via the use of the arsenic LDD region.

It is still yet another object of this invention to fabricate specific peripheral NFET devices, using an ion implanted phosphorous LDD region, to reduce the risk of the hot electron effect.

In accordance with this present invention a method is described for fabricating CMOS semiconductor chips, in which an SRAM cell, designed for enhanced device performance, and peripheral devices, designed for reduced risk of reliability failures, are processed simultaneously. Twin well regions are created for both PFET and NFET devices, followed by a blanket P type, threshold voltage, ion implantation step. A gate oxide is then thermally grown followed be deposition of polysilicon, and subsequent doping of the polysilicon, via a phosphorous ion implantation, or a conventional POCL3 doping procedure. The polysilicon is then patterned, via photolithographic and reactive ion etching, (RIE), processing to create the gate electrode structures. Next photoresist masking is employed to allow an arsenic LDD region to be created only for the NFET device in the SRAM cell. Similar photoresist masking is then used to allow a phosphorous LDD to be created for the peripheral NFET devices. Finally a boron LDD region, used if needed for the PFET devices of the SRAM cell, is created, again using photoresist masking for selective ion implantation. An insulator spacer is created on the sidewall of all polysilicon gate structures, via deposition of a low pressure chemical vapor deposition, (LPCVD), silicon oxide layer, followed by a blanket, anisotropic RIE procedure. Photoresist masking is then used again to allow a heavily doped, arsenic source and drain region to be created for both the SRAM and peripheral NFET devices. Photoresist masking is then employed to allow heavily doped, boron source and drain regions to be created for the SRAM PFET devices.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming CMOS devices, in which specific SRAM cell, NFET devices, are fabricated for high performance, while other peripheral NFET devices are created to withstand greater reliability demands than the SRAM counterparts, will now be covered in detail. This process can also be used for other CMOS applications, such as LOGIC/ASIC circuits, now being currently manufactured in industry, therefore only the specific areas unique to understanding this invention will be covered in detail.

Figure 1:
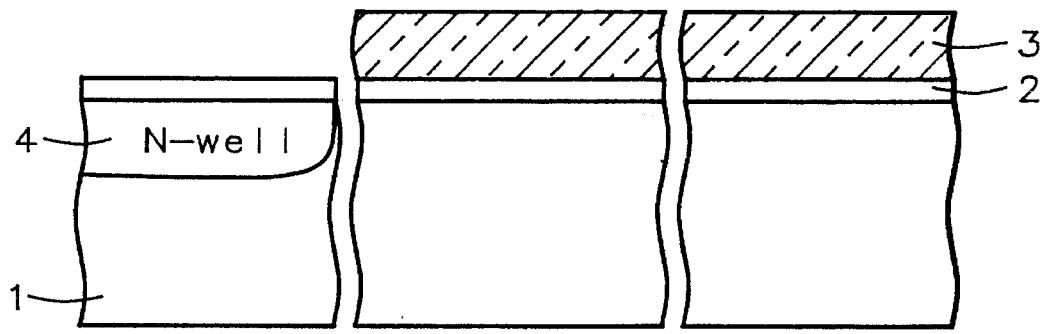
FIGS. 1–11, which schematically, in cross-sectional representation, describe the process used to fabricate high performance CMOS devices.
Figure 2:
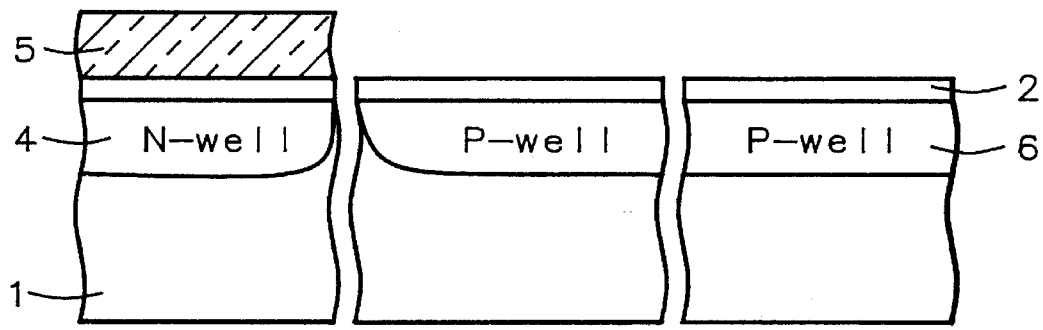

A substrate, 1, composed of N type, single crystal silicon with a <100> orientation is used, and shown in FIG. 1. A thin silicon dioxide film, 2, to be used as a screen oxide for subsequent ion implantation processes, is thermally grown at a temperature between about 900° to 1200° C., to a thickness between about 100 to 300 Angstroms. A masking photoresist pattern, 3, is then obtained followed by a phosphorous ion implantation step, at an energy between about 100 to 200 Kev., at a dose between about 5E12 to 1E13 atoms/cm2, used to create N well region 4, also shown in FIG. 1. After photoresist removal, using oxygen plasma ashing, another photoresist mask, 5, is created followed by ion implantation of boron, at an energy between about 70 to 120 Kev., at a dose between about 5E12 to 1E13 atoms/cm2, used to create P well region 6, shown schematically in FIG. 2.

Figure 3:
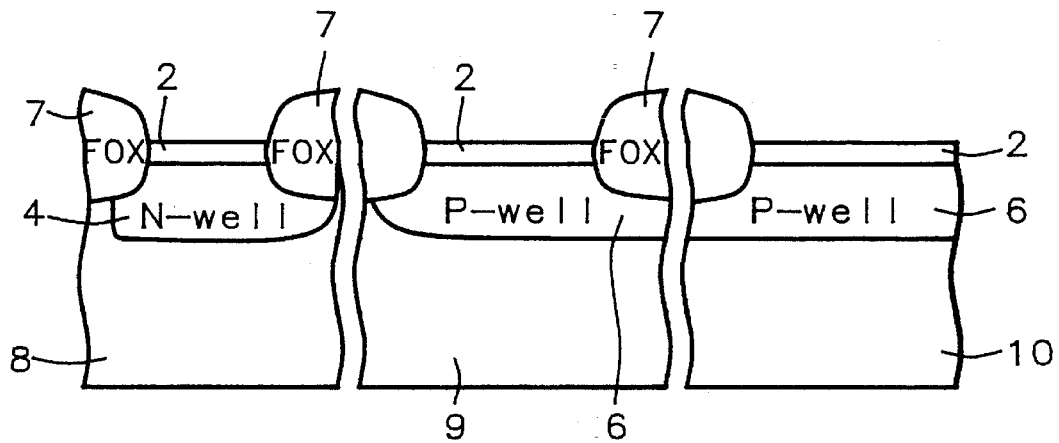

FIG. 3, shows the creation of thick field oxide regions, 7, used for isolation purposes. Silicon area, 8, will be used to create PFET devices, to be used in an SRAM, while silicon region, 9, will be used to fabricate the NFET counterparts of the SRAM cell. Silicon region, 10, will be used to construct the peripheral NFET structures. Briefly the method used to form the field oxide, (FOX), regions, is to create an oxidation mask of silicon nitride, on a silicon oxide layer, 2, on regions where the devices are to be built. This is accomplished via LPCVD deposition of silicon nitride, at a temperature between about 600° to 900° C., to a thickness between about 200 to 500 Angstroms, followed by photoresist patterning and RIE using CF4 and H2. After photoresist removal, followed by careful wet chemical cleans, the FOX region is created via thermal oxidation, in an oxygen—steam ambient, at a temperature between about 900° to 1200° C. to a thickness between about 4000 to 6000 Angstroms. After removal of the oxidation mask via a hot phosphoric acid for the silicon nitride layer, a blanket boron ion implantation step is performed at an energy between about 20 to 80 Kev., at a dose between 5E11 to 5E12 atoms/cm2. This step adjusts the threshold voltage, (Vt), of the NFET devices, increasing the Vt of the NFET devices to be created in the P well region for both the SRAM and peripheral devices. This ion implantation step also adjusts the Vt for the PFET devices, in the N well region, resulting in a lowering of the PFET Vt.

Figure 4:
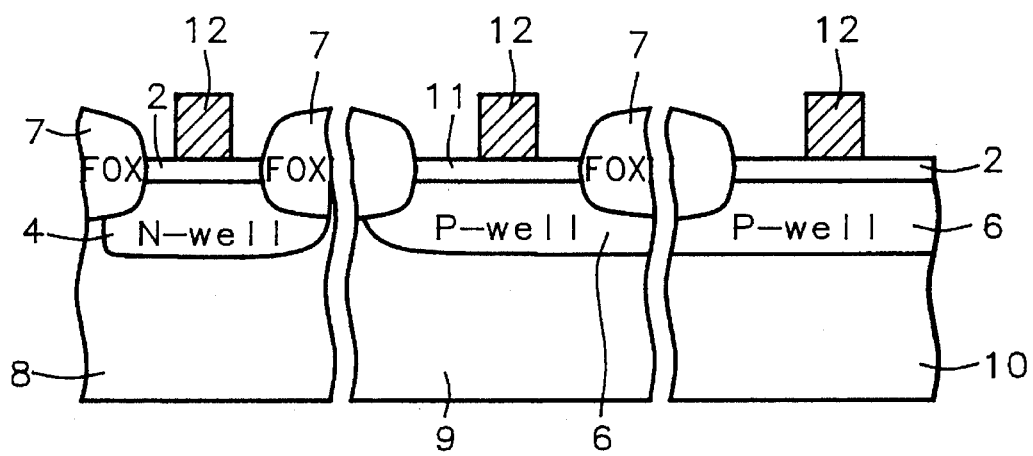

A buffered hydrofluoric acid solution is then used to remove silicon oxide, 2, followed by another wet chemical clean and a carefully grown gate oxide, 11, shown in FIG. 4. The gate oxide is grown in an oxygen—steam ambient, at a temperature between about 800° to 1000° C., to a thickness between about 50 to 200 Angstroms. Next a polysilicon layer, 12, is deposited using LPCVD processing, at a temperature between about 580° to 650° C., to a thickness between about 1000 to 3000 Angstroms. The polysilicon layer is doped via ion implantation of phosphorous, at an energy between about 40 to 150 Kev., at a dose between about 1E15 to 5E15 atoms/cm2. Polysilicon doping can also be accomplished via POC13 processing at a temperature between about 850° to 1000° C. The polysilicon gate structures are then formed using conventional photolithographic processing, followed by anisotropic RIE procedures using a C12 chemistry, using gate oxide 11, for endpoint. Photoresist removal, via oxygen plasma ashing, and careful wet cleans, are then performed.

Figure 5:
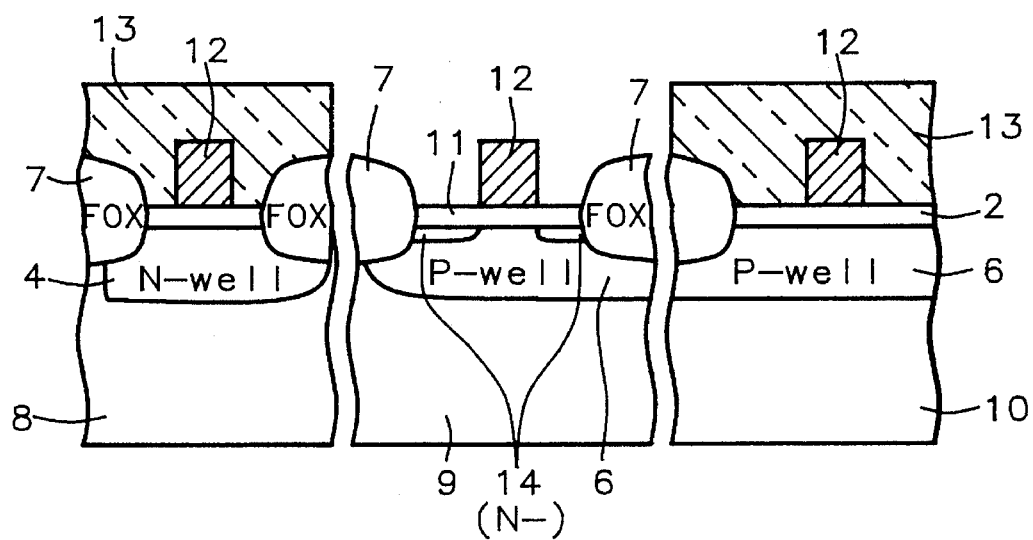
Figure 6:
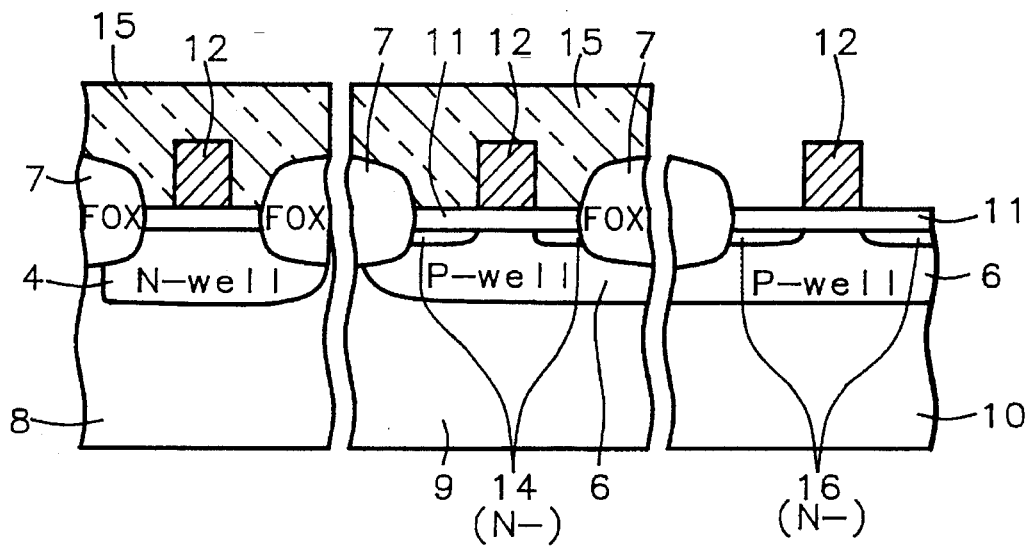
Figure 7:
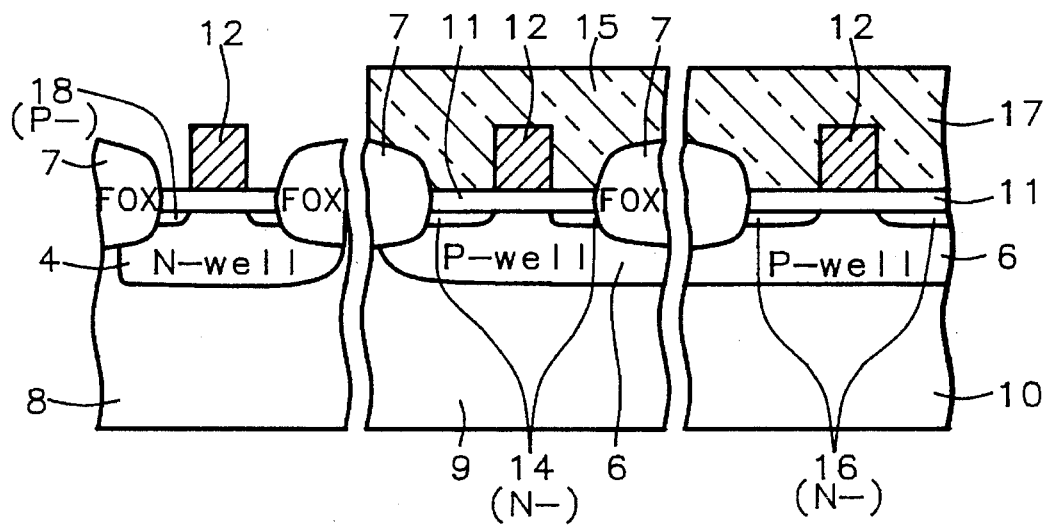

FIGS. 5–6, describe the critical fabrication process used to create the LDD regions for the SRAM NFET, as well as for the peripheral NFET. It will be shown that the process used for LDD formation, is highlighted by an arsenic LDD for the SRAM cell design, while a phosphorous LDD is used for the peripheral NFET device. Concentrating on the SRAM cell NFET, 9, photoresist masking, 13, is used to block out all regions but region 9. An arsenic ion implantation is performed at an energy between about 30 to 50 Kev., at a dose between about 1E13 to 1E14 atoms/cm2, resulting in a SRAM cell NFET LDD region, 14. The use of the slower diffusing arsenic dopant allows for a more conductive LDD region, then for example a faster diffusing phosphorous dopant. Therefore the use of arsenic, for the SRAM cell NFET results in a lower series resistance and a higher Idsat, then would have been obtained if phosphorous had been used. Additional performance benefits, via the use of arsenic for the SRAM cell NFET, are arrived at by minimizing gate to source and drain overlap capacitance. If the faster diffusing phosphorous dopants were used more of the LDD would be located under the gate. The slower diffusing arsenic region also reduces the short channel effect, resulting in slightly longer channel lengths then phosphorous counterparts for a specific gate dimension. Finally subthreshold leakage is less of a concern with the longer channel lengths obtained via the use of arsenic. Thus an extra cell photomasking, and ion implantation step, that may have been needed if phosphorous were used for the SRAM NFET, now can be eliminated with arsenic LDDs. However, the higher concentration gradient, existing at the aresenic LDD—channel region interface, may aggravate hot carrier electron, (HCE) injection, effects. This is not a serious concern for the SRAM NFET, due to the operating conditions of the cell, but would adversely effect the peripheral NFET, 10, if that device was fabricated using an arsenic LDD. Therefore the photoresist blockout, 13, used to create the arsenic LDD in the SRAM NFET, is removed via oxygen plasma ashing, and an anneal is performed at a temperature between about 850° to 950° C., for a time between about 20 to 40 min, in a nitrogen ambient. Next another photoresist blockout, 15, is formed to allow only the peripheral NFET device to receive a phosphorous ion implantation at an energy between about 30 to 80 Kev., at a dose between about 1E13 to 1E14 atoms/cm2, to form phosphorous LDD region, 16. The faster diffusing phosphorous dopant will result in a less severe concentration gradient at the LDD—channel region interface, and thus be able to withstand the more severe operating conditions, then devices made with an arsenic LDD. Finally the LDD process for the SRAM PFET is addressed by again stripping photoresist mask 15, and forming photoresist blockout mask 17, allowing the PFET to experience a BF2 ion implantation at an energy between about 20 to 60 Kev., at a dose between about 8E12 to 1E14 atoms/cm2, to form the SRAM PFET LDD region 18, shown in FIG. 7.

Figure 8:
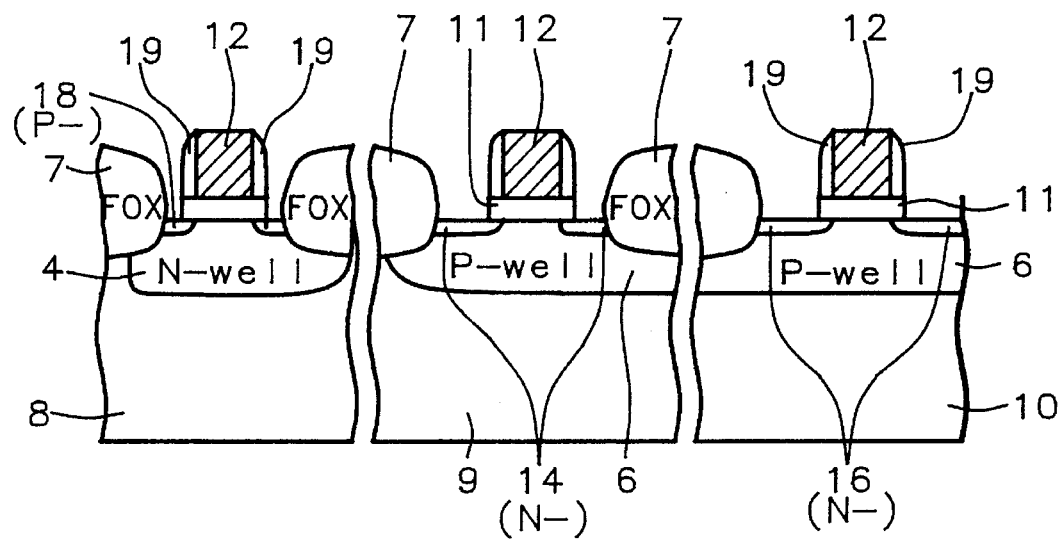
Figure 9:
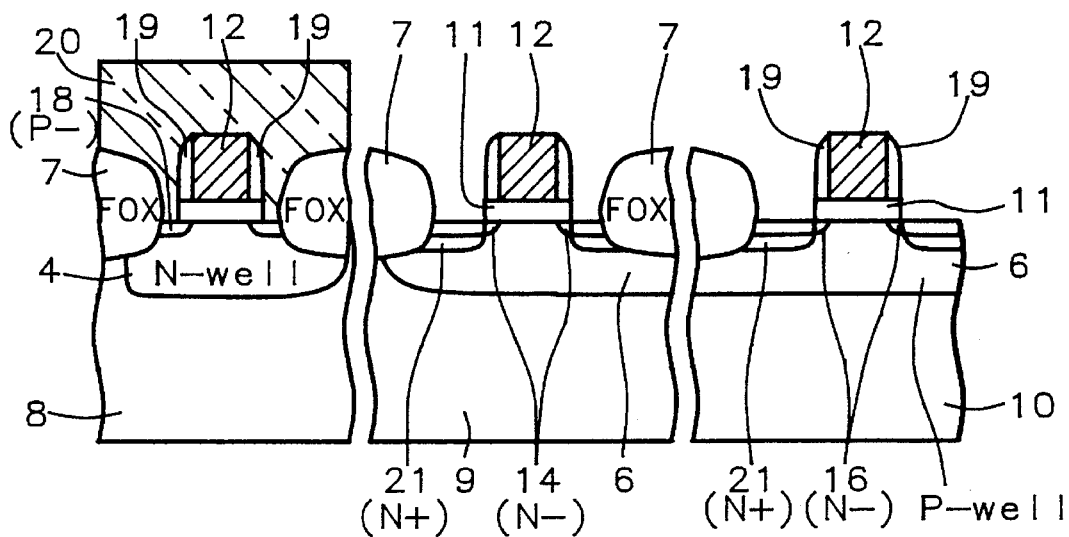
Figure 10:
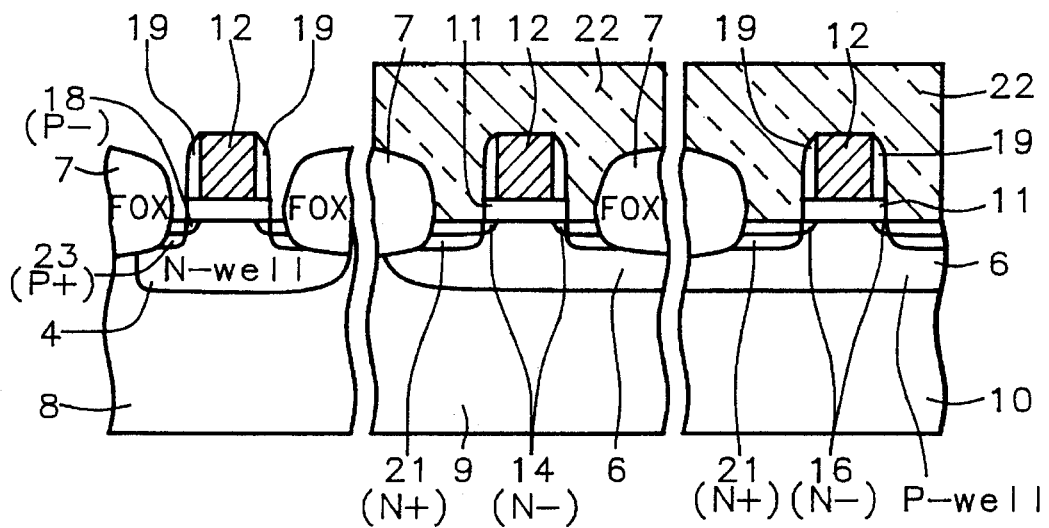

After photoresist blockout mask 17, is removed via oxygen plasma ashing, followed by careful wet cleans, a silicon oxide layer is deposited using LPCVD or plasma enhanced chemical vapor deposition, (PECVD), using tetraethylorthosilicate, (TEOS), as a source, at a temperature between about 650° to 750° C., to a thickness between about 1000 to 3000 Angstroms. A blanket, anisotropic RIE procedure is then employed, using CHF3, to form an silicon oxide spacer, 19, on the sidewalls of all polysilicon gate structures. This is shown in FIG. 8. Next the heavily doped N type source and drain regions are formed for both the SRAM and peripheral NFETs. This is accomplished by using photoresist blockout 20, allowing an arsenic ion implantation to be performed to only the SRAM and peripheral NFETs, at an energy between about 30 to 60 Kev., at a dose between about 2E15 to 5E15 atoms/cm2, to form the heavily doped N type source and drain regions, 21, shown in FIG. 9. The heavily doped region, 21, results in a lowering of resistance, and since this region does not interface with the channel region of the peripheral NFET device, the HCE phenomena is not influenced. The heavily doped P type source and drain regions are next formed. Again photoresist removal of blockout mask 20 is accomplished via oxygen plasma ashing, followed by photoresist application and patterning to obtain blockout mask 22. This mask allows only the PFETs to experience a BF2 ion implantation, at an energy between about 25 to 60 Kev., at a dose between about 2E15 to 5E15 atoms/cm to form the heavily doped P type source and drain regions, 23, for the SRAM PFET, shown in FIG. 10.

Figure 11:
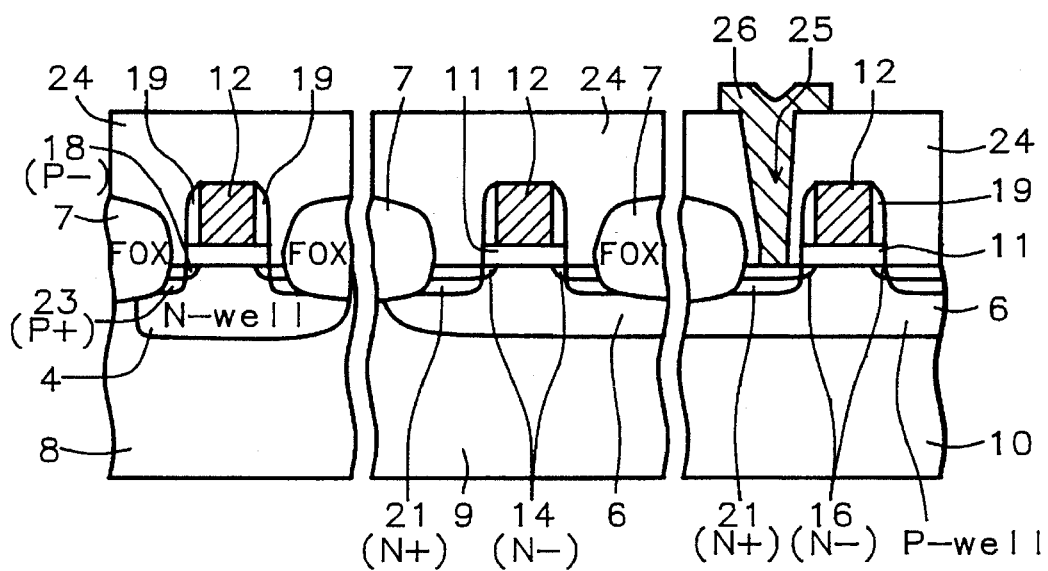

FIG. 11, shows the passivation and metallization sequence used for this CMOS structure. For purposes of clarity only the peripheral NFET device will be used. First a layer of silicon oxide, 24, is grown using PECVD processing at a temperature between about 400° to 600° C., to a thickness between about 4000 to 8000 Angstroms. Photolithographic and RIE processing are used to create contact holes, 25. After photoresist removal, via oxygen plasma ashing, followed by careful wet cleans, an Al—Cu—Si film is deposited using r.f. sputtering or evaporation processes, to a thickness between about 4000 to 6000 Angstroms. Photolithographic and RIE processing are then used to create metal structure, 26, shown in FIG. 11.

While this invention has been particularly shown and described with reference to, the preferred embodiments thereof, it will be understood by those skilled in the art that various changes in form and details may be made without departing form the spirit and scope of this invention.

What is claimed is:

1. A method for forming MOSFET devices on semiconductor substrates, comprising the steps of:

growing a screen oxide on said semiconductor substrate;

ion implanting a first conductivity imparting dopant into a first specific area of said semiconductor substrate;

ion implanting a second conductivity imparting dopant into a second specific area of said semiconductor substrate;

forming field oxide regions in said semiconductor substrate, for isolation of device regions;

ion implantation of a third conductivity imparting dopant into said semiconductor substrate, not covered by said field oxide regions;

removal of said screen oxide from said semiconductor substrate, not covered by said field oxide regions;

growing a gate oxide on surface of said semiconductor substrate, not covered by said field oxide regions;

depositing a polysilicon layer on said gate oxide, and on said field oxide regions;

ion implanting a fourth conductivity imparting dopant into said polysilicon layer;

patterning of said polysilicon layer to form polysilicon gate structures on said gate oxide;

ion implanting a fifth conductivity imparting dopant into said device region, in an area of said second specific region of said semiconductor substrate, not covered by said polysilicon gate structure;

annealing of said semiconductor substrate;

ion implanting a sixth conductivity imparting dopant into said device region, in a different area of said second specific region of said semiconductor substrate, not covered by said polysilicon gate structure;

ion implanting a seventh conductivity imparting dopant into said device region, in said first specific region of said semiconductor substrate, not covered by polysilicon gate structure;

depositing a first insulator layer on surface of said semiconductor substrate;

anisotropic etching to remove said first insulator layer to form insulator spacer on sidewalls of said polysilicon gate structure;

ion implanting an eighth conductivity imparting dopant into said device region, in said second specific region of said semiconductor substrate, not covered by said polysilicon gate structure; and ion implanting a ninth conductivity imparting dopant into said device region, in said first specific region of said semiconductor substrate, not covered by said polysilicon gate structure.

2. The method of claim 1, wherein said MOSFET devices are designed as a static random access memory, (SRAM), cell configuration, with P type and N type MOSFET cell devices, and N type of peripheral MOSFET devices.

3. The method of claim 1, wherein said MOSFET devices are designed as LOGIC/ASIC, (application specific integrated circuit), configurations, with P type and N type MOSFET devices.

4. The method of claim 1, wherein said first conductivity imparting dopant is phosphorous, ion implanted at an energy between about 100 to 200 Kev., at a dose between about 5E12 to 1E13 atoms/cm2.

5. The method of claim 1, wherein said second conductivity imparting dopant is boron, ion implanted at an energy between about 70 to 120 Kev., at a dose between about 5E12 to 1E13 atoms/cm2.

6. The method of claim 1, wherein said third conductivity imparting dopant is boron, ion implanted at an energy between about 20 to 80 Kev., at a dose between about 5E11 to 5E12 atoms/cm2.

7. The method of claim 1, wherein said third conductivity imparting dopant is BF2, ion implanted at an energy between about 20 to 80 Kev., at a dose between about 5E11 to 5E12 atoms/cm2.

8. The method of claim 1, wherein said gate oxide is grown at a temperature between about 800° to 1000° C., to a thickness between about 50 to 200 Angstroms.

9. The method of claim 1, wherein said polysilicon layer is deposited using LPCVD processing, at a temperature between about 580° to 650° C., to a thickness between about 1000 to 3000 Angstroms.

10. The method of claim 1, wherein said fifth conductivity imparting dopant is arsenic, ion implanted at an energy between about 30 to 50 Kev., at a dose between about 1E13 to 1E14 atoms/cm2.

11. The method of claim 1, wherein said anneal is performed at a temperature between about 850° to 950° C., in an nitrogen ambient, for a time between about 20 to 40 min.

12. The method of claim 1, wherein said sixth conductivity imparting dopant is phosphorous, ion implanted at an energy between about 30 to 80 Kev., at a dose between about 1E13 to 1E14 atoms/cm2.

13. The method of claim 1, wherein said seventh conductivity imparting dopant is BF2, ion implanted at an energy between about 20 to 60 Kev., at a dose between about 8E12 to 1E14 atoms/cm2.

14. The method of claim 1, wherein said first insulator layer is silicon oxide, depositing using LPCVD processing, at a temperature between about 650° to 750° C., to a thickness between about 1000 to 3000 Angstroms.

15. The method of claim 1, wherein said eighth conductivity imparting dopant is arsenic, ion implanted at an energy between about 30 to 60 Kev., at a dose between about 2E15 to 5E15 atoms/cm2.

16. The method of claim 1, wherein said ninth conductivity imparting dopant is BF2, ion implanted at an energy between about 25 to 60 Kev., at a dose between about 2E15 to 5E15 atoms/cm2.

17. A method for fabricating a CMOS chip on a semiconductor substrate, consisting of stactic random access memory, (SRAM), cells, with both P type and N type MOSFET devices, and peripheral N type MOSFET devices, comprising the steps of:

growing a screen oxide on said semiconductor substrate;

ion implanting a first conductuctivity imparting dopant into a first specific region of said semiconductor substrate, to form an N well region;

ion implanting a second conductivity imparting dopant into a second specific region of said semiconductor substrate, to form a P well region;

forming field oxide regions in said semiconductor substrate, for isolation of device region;

ion implantation of a third conductivity imparting dopant into said semiconductor substrate, not covered by said field oxide regions;

removal of said screen oxide from said semiconductor substrate, not covered by said field oxide regions;

growing a gate oxide on surface of said semiconductor substrate, not covered by said field oxide regions;

depositing a polysilicon layer on said gate oxide and on said field oxide regions;

ion implanting a fourth conductivity imparting dopant into said polysilicon layer;

patterning of said polysilicon layer to form polysilicon gate structures on said gate oxide;

ion implanting a fifth conductivity imparting dopant into said device region, in a specific area of said P well region to be used for said SRAM cell, to form N type lightly doped source and drain regions;

annealing of said semiconductor substrate;

ion implanting a sixth conductivity imparting dopant into said device region, in another specific area of said P well region to be used for said peripheral N type MOSFET devices, to form N type lightly doped source and drain region;

ion implanting a seventh conductivity imparting dopant into said device region, in a specific area of N well region, to form P type lightly doped source and drain region;

depositing a first insulator layer on surface of said semiconductor substrate;

anisotropic etching to remove said first insulator layer to form insulator spacer on sidewalls of said polysilicon gate structure;

ion implanting an eighth conductivity imparting dopant into said device region, in said specific area of said P well region to be used for said SRAM cell, and in another said specific area of said P well region, to be used for said peripheral N type MOSFET devices, to form heavily doped, N type source and drain region; and ion implanting a ninth conductivity imparting dopant into said device region, in said specific area of N well region, to form heavily doped P type source and drain region.

18. The method of claim 17, wherein said first conductivity imparting dopant is phosphorous, ion implanted at an energy between about 100 to 200 Kev., at a dose between about 5E12 to 1E13 atoms/cm2, to form said N well region.

19. The method of claim 17, wherein said second conductivity imparting dopant is boron, ion implanted at an energy between about 70 to 120 Kev., at a dose between about 5E12 to 1E13 atoms/cm2, to form said P well region.

20. The method of claim 17, wherein said third conductivity imparting dopant is boron, ion implanted at an energy between about 20 to 80 Kev., at a dose between about 5E11 to 5E12 atoms/cm2.

21. The method of claim 17, wherein said third conductivity imparting dopant is BF2, ion implanted at an energy between about 20 to 80 Kev., at a dose between about 5E11 to 5E12 atoms/cm2.

22. The method of claim 17, wherein said gate oxide is grown at a temperature between about 800° to 1000° C., to a thickness between about 50 to 200 Angstroms.

23. The method of claim 17, wherein said polysilicon layer is deposited using LPCVD processing, at a temperature between about 580° to 650° C., to a thickness between about 1000 to 3000 Angstroms.

24. The method of claim 17, wherein said fifth conductivity imparting dopant is arsenic, ion implanted at an energy between about 30 to 50 Kev., at a dose between about 1E13 to 1E14 atoms/cm2, to form said N type, lightly doped source and drain regions, for said SRAM cell, in said P well region.

25. The method of claim 17, wherein said anneal is performed at a temperature between about 850° to 950° C., in an nitrogen ambient, for a time between about 20 to 40 min.

26. The method of claim 17, wherein said sixth conductivity imparting dopant is phosphorous, ion implanted at an energy between about 30 to 80 Kev., at a dose between about 1E13 to 1E14 atoms/cm2, to form said N type, lightly doped source and drain regions, for said peripheral N type MOSFET devices, in said P well region.

27. The method of claim 17, wherein said seventh conductivity imparting dopant is BF2, ion implanted at an energy between about 20 to 60 Kev., at a dose between about 8E12 to 1E14 atoms/cm2, to form said P type, lightly doped source and drain regions, in said N well region.

28. The method of claim 17, wherein said first insulator layer is silicon oxide, deposited using LPCVD processing, at a temperature between about 650° to 750° C., to a thickness between about 1000 to 3000 Angstroms.

29. The method of claim 17, wherein said eighth conductivity imparting dopant is arsenic, ion implanted at an energy between about 30 to 60 Kev., at a dose between about 2E15 to 5E15 atoms/cm2, to form said heavily doped, N type, source and drain region, for said SRAM cell, and for said peripheral N type MOSFET devices, in said P well region.

30. The method of claim 17, wherein said ninth conductivity imparting dopant is BF2, ion implanted at an energy between about 25 to 60 Kev., at a dose between about 2E15 to 5E15 atoms/cm2, to form said heavily doped, P type, source and drain regions, in said N well region.

* * * * *